(12) United States Patent
Deane et al.

(10) Patent No.: US 6,627,305 B1
(45) Date of Patent: Sep. 30, 2003

(54) SUBSTRATES FOR LARGE AREA ELECTRONIC DEVICES

(75) Inventors: Steven C. Deane, Redhill (GB); Cornelis Van Berkel, Hove (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/112,263

(22) Filed: Jul. 8, 1998

(30) Foreign Application Priority Data

Jul. 16, 1997 (GB) .............................. 9714919
Oct. 1, 1997 (GB) .............................. 9720713

(51) Int. Cl.[7] .............................. B32B 3/26; B32B 3/00
(52) U.S. Cl. .............................. 428/304.4; 428/312.6; 428/319.1; 428/429; 428/446; 428/687; 428/701
(58) Field of Search ..................... 428/1, 304.4, 312.6, 428/319.1, 429, 446, 687, 701

(56) References Cited

U.S. PATENT DOCUMENTS

| 4,196,232 A | * | 4/1980 | Schnable et al. | ......... 527/255.3 |
| 4,394,401 A | * | 7/1983 | Shioya et al. | ............... 427/39 |
| 4,737,379 A | * | 4/1988 | Hudgens et al. | .............. 427/39 |
| 5,130,829 A | | 7/1992 | Shannon | ...................... 359/59 |
| 5,221,364 A | | 6/1993 | Hotaling | ...................... 136/249 |
| 5,242,530 A | * | 9/1993 | Batey et al. | ................. 156/613 |
| 5,270,711 A | | 12/1993 | Knapp | ............................ 341/34 |
| 5,272,370 A | | 12/1993 | French | .......................... 257/353 |
| 5,325,442 A | | 6/1994 | Knapp | ............................. 382/4 |
| 5,349,174 A | | 9/1994 | Van Berkel et al. | ......... 250/208 |
| 5,358,776 A | | 10/1994 | Hotaling | ..................... 428/304 |

FOREIGN PATENT DOCUMENTS

EP 0649048 A1 4/1995
JP 8184816 7/1996

OTHER PUBLICATIONS

C. van Berkel et al entitled "Multi–View 3D–LCD" published in S.P.I.E. Proceedings, vol. 2653, pp. 32 to 39. 1/96.

* cited by examiner

*Primary Examiner*—Elizabeth M. Cole
*Assistant Examiner*—Hai Vo
(74) *Attorney, Agent, or Firm*—Ernestine C. Bartlett

(57) ABSTRACT

A light-weight substrate (10) for thin film, large area electronic devices such as active matrix display devices, image sensing arrays and the like comprises a layer of rigid, cellular material (12) bonded to a comparatively thin glass sheet (11) on whose surface thin film circuit elements are provided. An aerogel material of higher than usual density can be used for the cellular layer. An array of microlenses may be provided between the cellular layer and the thin glass sheet.

9 Claims, 2 Drawing Sheets

SUBSTRATES FOR LARGE AREA ELECTRONIC DEVICES

BACKGROUND OF THE INVENTION

This invention relates to substrates for large area electronic devices such as flat panel display devices, for example, liquid crystal display devices, and other devices comprising thin film circuit elements carried on substrates.

Liquid crystal display devices typically comprise two planar glass substrates which are sealed together around their peripheries with a gap between their facing surfaces in which liquid crystal material is contained. On the facing surfaces of the two substrates electrodes are provided to which electrical potentials can be applied in order to obtain required display effects. The substrates usually also carry alignment layers and, in the case of a colour display device, a colour filter layer. In simple display devices the electrodes may define display segments providing, for example, alphanumeric display information. In other display devices, for example as used for datagraphic display screens for computers, the electrodes may define a row and column array of display elements which are connected to sets of row and column address lines. In an active matrix display device each display element can have an associated switching device, usually in the form of a TFT (thin film transistor) or a TFD (thin film diode) which devices are carried on the inner surface of one of the substrates and connected to address lines. Glass sheets used for the substrates are relatively inexpensive and generally compatible with the processing technology used to provide the electrodes and other required layers thereon. However, the weight of the glass sheets can be a problem, particularly in larger area display devices and those used in portable equipment such as laptop computers and PDA's where the glass substrates can constitute a significant part of the overall weight of the equipment. It is known also to use plastic substrates, for example polyimide, PET or PES polymer materials, but then there may be problems in making, for example, stable liquid crystal cells with such plastic substrates because they exhibit flexibility and can cause difficulties during the lithographical processing of films deposited thereon, as required for electrodes, address lines and switch element layers for example, due to their poor dimensional stability. Other known kinds of large area electronic devices similarly using glass sheets as substrates for carrying thin film circuit elements include sensing arrays, for example 2D image sensing arrays comprising a matrix of diode light sensing elements such as described in U.S. Pat. No. 5,349,174 fingerprint or touch sensing arrays as described in U.S. Pat. Nos. 5,325,442 and 5,270,711 and thin film memory array devices as described in U.S. Pat. No. 5,272,370.

OBJECTS AND SUMMARY OF THE INVENTION

It is an object of the present invention to provide a substrate for use in large area electronic devices which overcomes the aforementioned problems at least to an extent.

According to one aspect of the present invention, there is provided a substrate for carrying on an insulating surface thereof thin film circuit elements in a large area electronic device which is characterised in that the substrate comprises a thin glass sheet bonded to a layer of rigid, cellular material.

According to another aspect of the present invention, a large area electronic device, such as a matrix display device or sensing array device, having a substrate on which thin film circuit elements are carried is characterised in that the substrate comprises a thin glass sheet on one side of which the thin film circuit elements are carried and whose other side is bonded to a layer of rigid, cellular, material.

By replacing a conventional sheet of glass with such a composite structure a considerable weight saving can be achieved. The glass sheet used in the composite structure can be significantly thinner since the structural strength and rigidity required for the substrate is provided by the cellular material which itself, being cellular, can be of light weight compared with, volume for volume, glass material. Typically, the glass sheet may be around 0.1 mm thick compared with around 0.7 to 1 mm thickness for a conventionally used glass substrate. As one side of the laminate structure is constituted by solid glass, a high quality, electrically—insulating, surface suitable for use as a base on which to form thin film circuit layers is still available.

The rigid, cellular material preferably comprises an aerogel. A substrate formed of aerogel material alone would be rough, as well as porous, and therefore not suitable for use as a substrate for large area electronic device applications, but has the rigidity and strength required, while being of relatively low weight, so that when combined with a thin glass sheet, and comparatively much thicker, the resulting combination satisfies the requirements for such a substrate. The composite substrate can readily be made by forming a layer of aerogel material directly on one side of the thin glass sheet. Aerogel materials are silicate sponges produced by a sol gel process which have been developed principally for their thermal insulation properties for use for example in windows and can be made with solid volume fractions as low as around 1% or even less which means they have low weight as well as good thermal insulation properties. Because of the common nature of their constituents the physical properties, such as the thermal expansion coefficients, of the component layers of the substrate are similar. Importantly for display device and other applications where substrate transparency is required, the transparency of the aerogel layer is reasonably good as the cells of their structure are small, typically having a dimension of a few nanometres to tens of nanometres. Such a cell structure would not result in any strong scattering of light.

For increased robustness the aerogel layer preferably has a higher than usual density. In a preferred embodiment, the thickness of the glass sheet is around 0.1 mm. Sheets of electronic grade glass having high quality surfaces suitable for use as substrate surfaces in large area electronic devices and of such thickness are available commercially. The thickness and density of the aerogel layer are then selected to provide the required rigidity and strength to the substrate. To this end, the aerogel layer desirably has, for example, a solid content of around 10–30% by volume and a thickness of around 0.5 to 1 mm. Besides being of comparatively low weight, around 10–30% of a similarly sized solid glass sheet, such an aerogel layer also offers high dimensional and mechanical stability.

The cellular layer need not be bonded directly to the glass sheet but may be bonded through an intermediate layer. In a particular embodiment, the substrate may include a microlens array between the glass sheet and the cellular layer. Microlens arrays, which term is intended herein to include microprism arrays, are used in certain kinds of matrix display devices, such as autostereoscopic display devices, to control or direct light input to or output from the display pixels. Such microlens arrays are often carried on a separate glass plate which is attached to the display device. The incorporation of a microlens array in the substrate to be used for the display device therefore leads to a further beneficial weight saving by eliminating the requirement for a further, separate, substrate. Moreover, because the microlens array is provided in the substrate which is to carry thin film elements of the pixel array, accurate alignment between the microlens elements and the pixels can be ensured. Further, optical advantages can be obtained due to the microlens array being positioned adjacent to the thin glass sheet and therefore much closer to the actual pixels. Such a substrate can also be used other large area electronic devices such as for example image sensing devices in which microlens elements are used to direct or concentrate incoming light onto photosensitive elements.

The microlens array can conveniently be formed using known materials and techniques directly on the surface of the glass sheet, but preferably by a resin molding process, and then covered by the deposited cellular layer. Such a microlens array may have an overall thickness of around 10 $\mu$m and so the thickness of the substrate is not unduly increased. Optical performance of the microlens array need not be affected significantly through being embedded. Depending on the refractive indices of the materials used to form the microlens array and the cellular layer only a small loss in optical power is likely.

The form of the microlens elements may be varied and of any known shape, for example spherical or elliptical, toroidal or cylindrically elongate, depending on their intended purpose. The array may be provided in the form of a continuous layer in which adjacent microlens elements join one another or the elements may be spaced slightly apart from one another. In the former case, the microlens array physically separates the cellular layer from the glass sheet and bonding of the layer to the sheet is achieved via the array. In the latter case, the cellular layer can extend around the individual microlens elements and contact the surface of the glass sheet in the spaces between the elements so that bonding between the cellular layer and the glass sheet is achieved directly in part.

It is envisaged that cellular materials other than an aerogel material could be utilised. In the case where transparency is desired, a cellular glass structure may be used. Certain glass compositions undergo phase separation on solidification resulting in an interpenetrating, open cell, network. This network can be opened up by the selective etching and removal of one phase. The resulting structure is porous, and hence light weight. This glass cellular structure could be formed as a sheet and bonded to the thin, solid, glass sheet to provide the composite substrate, the solid sheet being, for example, of a higher grade glass material more suited for use with thin film processing technology. However, it may be possible to use a multi-phase composition sheet and etch it selectively through part only of its thickness so as to leave a relatively thin, solid layer adjacent one side. Although the nature of the solid layer, and hence its compatibility with subsequent processing stages, would then be dictated by the original glass composition, it may be adequate for certain kinds of applications.

BRIEF DESCRIPTION OF THE DRAWINGS

Substrates for large area electronic devices, and devices incorporating such, in accordance with the invention will now be described, by way of example, with reference to the accompanying drawings, in which.

DESCRIPTION OF THE PREFERRED EMBODIMENTS

Figure 1:
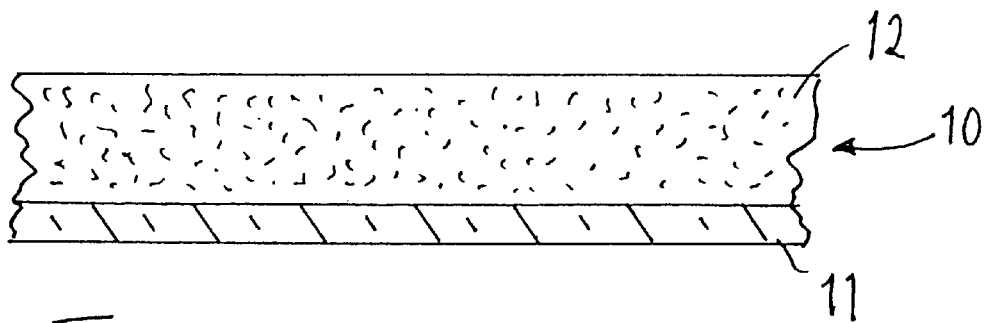
FIG. 1 is a schematic cross-sectional view through part of an embodiment of a substrate according to the invention.

It will be appreciated that the figures are merely schematic and are not drawn to scale. In particular certain dimensions such as the thickness of layers or regions may have been exaggerated while other dimensions may have been reduced. The same reference numerals are used throughout the Figures to indicate the same, or similar, parts.

Referring to FIG. 1, the substrate 10 consists of an electrically insulating and optically transparent laminate structure comprising a thin sheet 11 of commercially available electronic grade glass on one side of which a layer 12 of light weight cellular material comprising silica aerogel is provided to form a unitary structure.

The substrate is produced by forming the aerogel layer 12 directly on the surface of the glass sheet 11. Aerogels are sol-gel derived supercritically dried materials with high porosities, typically up to 98%. Known techniques can be used to form the aerogel layer. Example processes are described in U.S. Pat. No. 5,358,776 to which reference is invited for details and whose disclosure in this respect is incorporated herein by reference. Briefly, a process for preparing the aerogel, according to this specification, involves the hydrolysis and condensation of tetraethoxysilane (TEOS) and/or tetramethoxysilane (TMOS) to produce gels which are then supercritically extracted to a low-density silicon glass network. Materials with densities between 20 to 1100 mg/cc can be produced by this single-step sol-gel process. Another example method described in this specification uses a two-step extraction process which allows lower temperatures and pressures than required by the one-step process, and instead of requiring a dilute solution to gel, a partially hydrolysed, partially condensed polysilicate mixture is prepared in which the alcohol is replaced as the solvent and then supercritically extracted. Liquid carbon dioxide is used to purge the system of the alcohols and then, for example by heating up the system to a relatively low temperature, the replacement carbon dioxide is driven off in a drying unit such as an autoclave, to leave a very low density dioxide aerogel with densities ranging between 3 to 900 mg/cc.

In forming the aerogel layer 12 on the glass sheet 11, the precursor solution, prior to gelling, is applied over the upper surface of the sheet, for example by spinning, so that the aerogel layer when formed is in direct bonding contact with the sheet 11.

In this particular embodiment, the sheet 11 is a glass micro-sheet of approximately 0.1 mm thickness and the aerogel layer is formed to a thickness of around 0.5 mm to 1 mm. Although aerogels can be extremely porous, for example as low as 1% solid content, the solid content of the aerogel layer 12 used is higher than normal, preferably around 10 to 30% so as to provide rigidity and strength to the substrate sufficient for most large area electronic device applications. Following the supercritical extraction of the solvent the aerogel layer 12 is left fused to the surface of the glass sheet 11.

With this composite substrate, the side of the glass sheet 11 remote from the layer 12 provides a high quality surface suitable for use as a base on which to provide thin film structures as required in large area electronic devices. The glass sheet offers high chemical resistance enabling standard thin film deposition and patterning processes to be used. Such films can comprise for, example, conductive layers of metals, such as Al or Cr, or ITO forming electrically conductive lines, tracks, contacts or electrodes, layers of semiconducting material, such as hydrogenated amorphous or polycrystalline silicon, and insulating layers, for example silicon nitride or silicon oxide, which are deposited on the substrate and patterned, for example by a photolithographic definition and etching process, to form the required structures. The substrate, comprising glass and silica aerogel materials, is entirely compatible with the deposition and definition processes normally used for such purposes (e.g. PECVD). The substrate is robust and impact resistant, making it easy to handle in a production environment and exhibits adequate dimensional stability. Importantly, the substrate is considerably lighter than currently—used solid glass substrates and therefore advantageous for use in large area electronic devices intended for portable use. Although the surface of the aerogel layer 12 remote from the glass sheet 11 would be relatively rough, as well as porous, this is unlikely to be a problem in most envisaged uses of the substrate. However, this surface could be coated with a protective, sealing layer, for example of SOG (spin on glass), silicon oxide or a plastics material such as polyimide, if desired.

The thickness of the sheet 11 may be increased if desired, in which case the thickness and/or density of the aerogel layer 12 may be varied accordingly.

Figure 2:
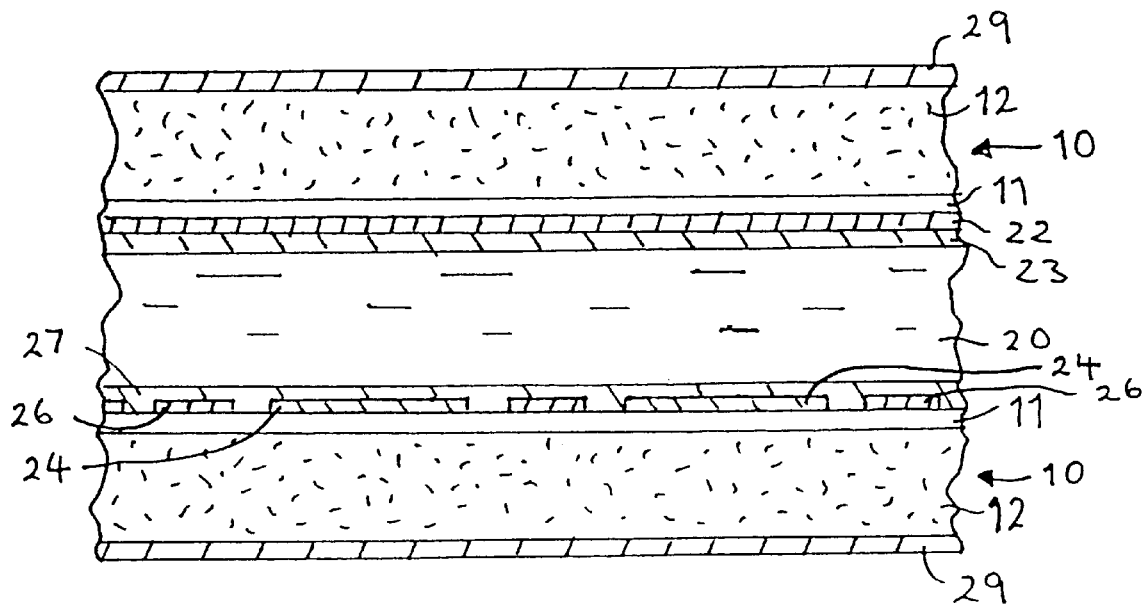
FIG. 2 is a schematic cross-sectional view through part of a large area electronic device, in this example a liquid crystal display device, using the substrate of FIG. 1.

FIG. 2 illustrates the use of a substrate in a large area electronic device comprising an active matrix liquid crystal display device. In this particular example, both substrates of the device are of the above—described type. The two substrates 10 are arranged spaced apart with their glass sheets facing one another and sealed together around their periphery to contain the liquid crystal material 20 therebetween. The upper substrate 10 carries on its inner surface one or more transparent electrodes of ITO 22 and an LC alignment layer 23 overlying the electrodes. In the case of a colour display device, this substrate may also carry an array of colour filter elements and black matrix material surrounding the individual colour filters in known manner. The lower substrate 10 carries on its inner surface thin film circuit elements comprising a row and column array of individual pixel electrodes 24 of transparent conductive material such as ITO each of which is connected to an associated thin film switching device 26, in the form of a TFT or TFD, and one or more sets of address lines, for example sets of row and column address lines in the case of three terminal TFTs being used for the switching devices or simply a set of row address lines in the case of two terminal TFDs being used. Another LC alignment layer 27 overlies these components on the lower substrate. Active matrix liquid crystal display devices are well known and it is not thought necessary to describe here in detail the nature and fabrication of the thin film circuit elements and layers provided on the substrates. Typical examples of TFT and TFD display devices and their method of manufacture are described in U.S. Pat. No. 5,130,829 and EP-A-0 649048 respectively to which reference is invited.

For a transmissive mode of operation, polarising films 29 are provided over the outer surfaces of the two substrates 10. The substrates are transparent and because the pores of the aerogel layer 12 in each substrate are very small, typically only a few nanometers, light is not strongly scattered by this component of the substrates.

The substrate may be used also in passive liquid crystal display devices, for example having crossing sets of transparent electrodes carried on the inner facing surface of the two substrates and in display devices using electro-optic materials other than liquid crystal materials.

The substrate may be used for other larger area electronic device applications, for example a memory device of the kind described in U.S. Pat. No. 5,272,370 having an array of thin film circuit elements comprising different types of TFDs carried, together with associated address lines, on a common, insulating substrate, a touch sensing array device as described in U.S. Pat. No. 5,270,711 having an array of sensing elements carried on an insulating substrate each comprising a thin film circuit including a switching device, or an image sensing array comprising thin film photodiodes and associated thin film switch devices carried on a common substrate as described in U.S. Pat. No. 5,349,174.

In certain kinds of applications for matrix flat panel display devices there may be a need to associate an array of optical lenses with the display device for the purpose of directing, converging or diverging light passing through the pixels at either the input or the output side. For example, an array of spherical microlenses may be positioned over the input side of a transmissive LCD with each microlens element being aligned with a respective pixel for the purpose of collecting and converging generally parallel input light such that it passes through the pixel's aperture. An associated microlens element in a similar array positioned over the output side of the LCD collects light passed through the pixel and returns the rays to a generally parallel path. In this way, light directed onto the input side of the panel which would otherwise have been absorbed or reflected by opaque or reflective components, such as address lines, switching devices or black matrix, in the structure of the LCD is constructively utilised to form part of the display output. Such microlens arrays are thus beneficial when there is a need to minimise light loss and maximise light throughput.

Microlens arrays are also used in conjunction with flat matrix display panels to provide autostereoscopic display devices. In this case, the microlens array is provided in the form of a lenticular screen which is positioned over the output side of the matrix display panel. The lenticular elements magnify the pixels and project them in front of the user's eyes. Each microlens element, or lenticule, is usually arranged so as to overlie two, or more, adjacent columns of pixels. Two, or more, different images are displayed simultaneously on the display panel in a vertically interlaced manner and each image is presented to a respective eye of a viewer to create a stereoscopic effect. An example of such a display device is described in the paper by C. van Berkel et al entitled "Multi-View 3D-LCD" published in S.P.I.E. Proceedings, Vol. 2653, pages 32 to 39.

In these examples of display devices using microlens arrays, the microlens array is typically provided on a glass substrate which is mounted on the display panel. This not only adds to the overall weight of the display panel, particularly in the case of a large area display panel such as that used for autostereoscopic display purposes, but also necessitates accurate alignment between the microlens elements and the pixels in the display panel. Moreover, with this kind of arrangement the microlens elements are spaced away from the pixel plane by a distance at least equal to the thickness of the intervening glass substrate of the display panel. Optical advantages could be obtained if the microlens array were to be positioned closer to the plane of the pixels, for example if the microlens elements are to act as field lenses to prevent unwanted light spreading or if only short focal lengths are required.

Figure 3:
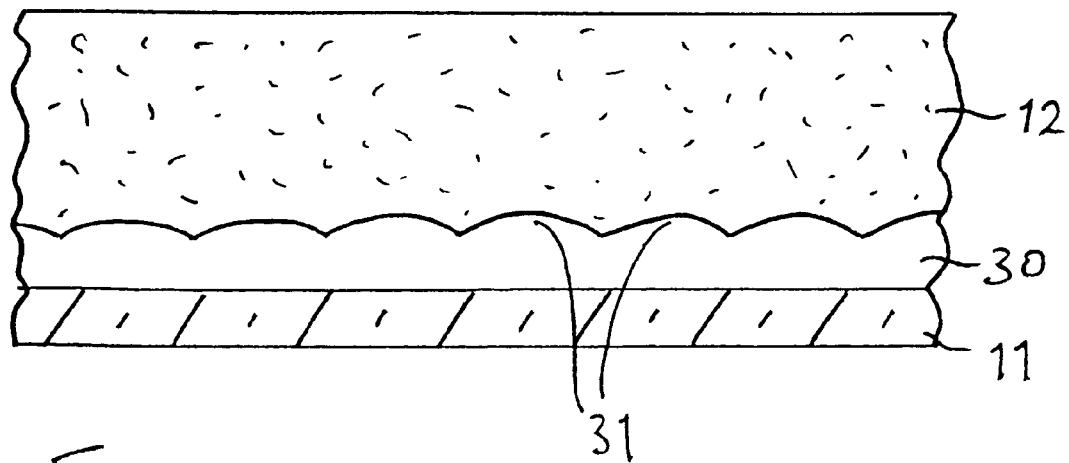
FIG. 3 is a cross-sectional view through part of another embodiment of a substrate according to the invention.

FIG. 3 shows a cross-sectional view through part of a further embodiment of a substrate according to the present invention which incorporates a microlens array embedded in the structure of the substrate. Referring to FIG. 3, the microlens array, 30, is provided between the aerogel layer 12 and the glass sheet 11. In fabricating this substrate, the array of microlenses may be formed in known manner by coating the surface of the glass plate 11 with a viscous photosensitive resist having a thickness, for example, of around 15 μm which is then exposed through a mask defining the required lens pattern and developed to produce an array of circular, or elongate, resist islands. The resultant structure is then heated or baked at around 150° C. at which temperature the resist melts and each island is drawn by surface tension into a lens shape.

Figure 4:
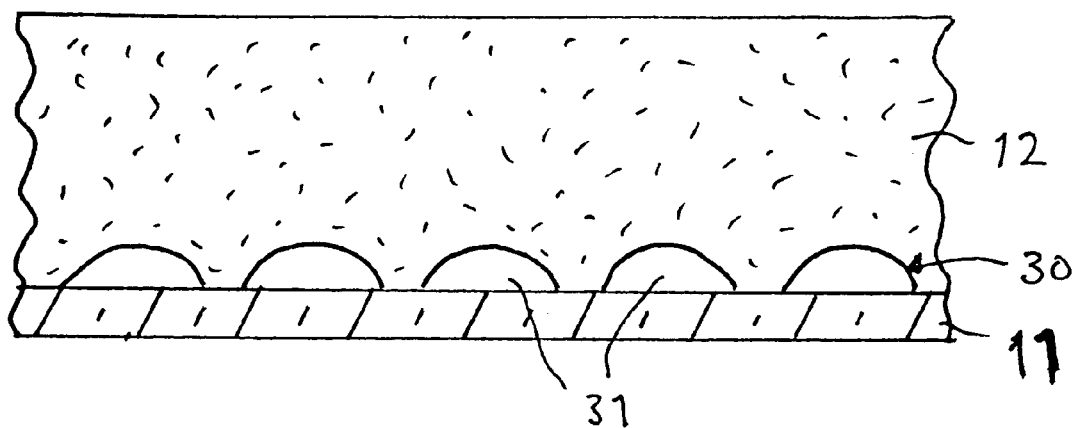
FIG. 4 illustrates a modified form of the substrate embodiment of FIG. 3.

Preferably, however, the array is formed on the surface of the glass plate 11 using a known molding process in which a UV sensitive resin is applied over a molding tool which determines the required shape for the lens element and pressed against the surface of the plate 11. The polymer is then cured and hardened by being subjected to UV radiation and the mold tool removed leaving the formed microlens array on, and adhered to, the surface of the plate. Such a method is better suited to producing a continuous microlens layer over the surface of the plate rather than the reflow photosensitive resist technique. In the substrate embodiment illustrated in FIG. 3, the microlens array 30 consists of a layer which extends continuously over the surface of the plate and whose surface remote from that plate comprises adjoining regions of convex shape, each providing a lens element 31. The regions may be dome—shape, i.e. spherical, toroidal, elliptical or elongate having a part—cylindrical shape. In FIG. 4, a modified form of microlens array is shown in which the individual microlens elements 31 do not join one another but instead are spaced slightly apart from one another on the surface of the plate 11.

It is envisaged that other methods known in the art for producing microlens arrays may be used instead. The microlens array could be of the graded index type formed by an ion exchange method in a separate thin glass sheet which is secured to the glass sheet 11 via a resin film.

Following the provision of the microlens array on the glass plate 11, the layer 12 of aerogel material is formed directly over the surface of the microlens array 30, and any exposed regions of the surface of the glass plate 11 in the case (FIG. 4) where adjacent microlens elements may be spaced slightly apart rather than adjoining one another, so as to surround and directly cover completely the exposed surfaces of the microlens elements. The inner surface of the aerogel layer 12 thus mirrors the profile of the microlens array and is in direct contact with the array. As in the previous embodiment, the outer surface is flat and substantially parallel to the plane of the glass plate 11. In the substrate structure of FIG. 3, the aerogel layer is in effect bonded to the glass plate 11 via the microlens array 30 whereas in the substrate structure of FIG. 4 such bonding is achieved partly via the microlens array and partly by direct contact between portions of the layer 12 and the surface of the plate 11. As before, the outer surface of the glass plate 11 provides a high quality surface on which to form the thin—film circuit elements.

In a possible alternative method of fabricating the substrate, the aerogel layer 12 may be formed on a mold having a surface shape matching that of the required microlens array so that the microlens element shapes are formed in the surface of the aerogel layer. The tool is then removed and resin applied over the shaped surface of the aerogel material and hardened so as to form the microlens array, the surface of the resin layer remote from the aerogel material being flat. The thin glass sheet 11 is then attached to this structure, possibly used a further, thin, resin layer for bonding the parts together, thereby again resulting in the substrate structure of FIG. 3 or 4.

By way of example of the thicknesses of the layers of the substrate, the glass plate 11 may be around 100 μm thickness, the microlens array 30 may be around 10 μm thickness and the aerogel layer 12 may be around 900 to 1000 μm thickness.

The refractive index of the polymer resin used for the microlens array 30 is similar to that of the glass plate 11, i.e. around 1.5, and the refractive index of the transparent aerogel layer is significantly lower, typically around 1.0 to 1.1. Although buried within the substrate structure, the performance of the microlens elements is not degraded and no significant loss of optical power results.

Substrates of the kind shown in FIGS. 3 and 4 can be used for large area electronic devices in similar manner to that of the previously described embodiment, for example to replace one, or both, of the substrates in the flat panel LC display device of FIG. 2. The substrate, with its embedded microlens array, provides a further weight saving benefit by eliminating the need to use a separate glass plate carrying the microlens array mounted on a substrate of the display panel. As the microlens elements and thin film elements of the pixel array are carried by the same substrate rather than separate substrates accurate alignment between the microlens elements and the display pixel array is readily obtained. Furthermore, the microlens elements are positioned closer to the plane of the pixels and therefore can act as field lenses and prevent unwanted light spreading effects.

The substrate may be employed also in, for example, large area image sensing arrays of the kind using a microlens array whose elements for example converge or concentrate incoming light onto the photosensitive elements. The substrate incorporating the microlens array may be used to carry the thin film photosensitive elements.

Depending on the required function of the microlens elements in the array, the shape, size and pitch of the microlens elements may be varied. Although certain shapes have been mentioned, for example, spherical or cylindrically elongate, the microlens elements of the array may be composed of adjoining flat surfaces rather than smoothly curved. It is to be understood in this respect that the term microlens elements includes microprism elements.

With regard to all the described embodiments, it is envisaged that light-weight cellular materials other than aerogels may be used for the layer 12. For example, the layer 12 may be formed instead by a glass composition of the type which undergoes phase separation when it solidifies. This results in an interpenetrating network of two, or more glass phases. After this phase separation has occurred, one phase can be etched away using a selective etchant which does not affect the other phase so as to leave an open-cell structure. Possibly, the entire substrate 10 could be produced using such a glass composition and etching the sheet from one side in controlled manner so as to leave a thin surface region of solid glass which then constitutes the glass sheet 11, making a separate glass sheet unnecessary. The light weight cellular material used for the layer 12 need not have a continuous open cell structure like the porous structure of an aerogel but may instead comprise closed cells or a combination of both.

From reading the present disclosure, other modifications will be apparent to persons skilled in the art. Such modifications may involve other features which are already known in the field of substrates for thin film large area electronic devices and component parts thereof and which may be used instead of or in addition to features already described herein.

What is claimed is:

1. A substrate for carrying on an insulating surface thereof thin film circuit elements in a large area electronic device, wherein the substrate comprises a thin glass sheet, a layer of rigid, cellular material and a microlens array provided between the layer of cellular material and the glass sheet.

2. A substrate according to claim 1, wherein the cellular material comprises an aerogel.

3. A substrate according to claim 2, wherein the aerogel has a density of around 10–30% by volume.

4. A substrate according to claim 1 the glass sheet has a thickness of about 0.1 mm.

5. A substrate according to claim 1, wherein the cellular material comprises a glass material having an interpenetrating, open-cell network.

6. A substrate according to claim 1, wherein the microlens array is carried directly on the surface of the glass sheet and the layer of cellular material directly covers the microlens array.

7. A substrate according to claim 6, wherein the layer of cellular material is bonded to the glass sheet at least in part via the microlens array.

8. A substrate according to claim 6, wherein the microlens array comprises molded resin material.

9. A large area electronic device comprising a substrate on which thin film circuit elements are carried, wherein the substrate comprises a substrate according to claim 1, and the thin film circuit elements are carried on the surface of the thin glass sheet.

* * * * *